United States Patent
Ng et al.

(10) Patent No.: US 9,246,485 B2
(45) Date of Patent: Jan. 26, 2016

(54) SINGLE LAYER SENSOR PATTERN

(71) Applicant: STMicroelectronics Asia Pacific Pte. Ltd., Singapore (SG)

(72) Inventors: Chee Yu Ng, Singapore (SG); Mythreyi Nagarajan, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 480 days.

(21) Appl. No.: 13/739,112

(22) Filed: Jan. 11, 2013

(65) Prior Publication Data

US 2014/0197880 A1 Jul. 17, 2014

(51) Int. Cl.
*H03K 17/96* (2006.01)
*G06F 3/044* (2006.01)

(52) U.S. Cl.
CPC ............ *H03K 17/9622* (2013.01); *G06F 3/044* (2013.01); *H03K 2017/9602* (2013.01)

(58) Field of Classification Search
None
See application file for complete search history.

(56) References Cited

U.S. PATENT DOCUMENTS

| | | | | |
|---|---|---|---|---|
| 2011/0316567 | A1* | 12/2011 | Chai et al. | 324/686 |
| 2012/0103777 | A1* | 5/2012 | Kang | 200/600 |
| 2012/0155614 | A1* | 6/2012 | Caiafa et al. | 378/111 |
| 2012/0262774 | A1* | 10/2012 | Bae et al. | 359/290 |
| 2012/0274602 | A1* | 11/2012 | Bita et al. | 345/174 |
| 2012/0319992 | A1* | 12/2012 | Lee | 345/174 |
| 2014/0027262 | A1* | 1/2014 | Kim et al. | 200/600 |
| 2014/0197880 | A1* | 7/2014 | Ng et al. | 327/517 |
| 2015/0101919 | A1* | 4/2015 | Bae et al. | 200/5 R |

* cited by examiner

*Primary Examiner* — Lincoln Donovan
*Assistant Examiner* — Khareem E Almo
(74) *Attorney, Agent, or Firm* — Gardere Wynne Property Sewell LLP (57) ABSTRACT

A single ITO layer design for a touchscreen panel incorporates a matrix of sensor cells formed from a single ITO layer of capacitive sensor pads, sensor bars, force lines and sense lines. Columns of multiplexed force lines are connected to rows of sensor pads to form force trees such that the force line of the end pair of sensor pads has a wide track, with the force lines of each subsequent pair of sensor pads having a reduced track width. Disposed between the columns of force trees, the matrix of sensor cells also includes columns of sensor bars connected to control circuitry via sense lines. The control circuitry applies a signal to the force trees to generate capacitance between rows of sensor pads and adjacent sensor bars. The control circuitry senses changes in the capacitance and resolves the location of a user touch in the matrix of sensor cells.

34 Claims, 10 Drawing Sheets

SINGLE LAYER SENSOR PATTERN

FIELD OF THE INVENTION

The present disclosure generally relates to capacitive touchscreen panels and, more particularly, to a single layer indium tin oxide (ITO) sensor pattern for use in a capacitive touchscreen panel.

BACKGROUND

Touchscreen panels are typically incorporated in various electronic devices to detect a user input (i.e., user touch) and to display content. The touchscreen panels include an active portion capable of detecting the user touch and displaying content. This active portion is typically formed from multiple layers of sensing circuitry, wherein each layer includes sensing nodes and routing circuitry for connecting the sensing nodes or other touch-detection circuitry to a controller. Each layer of sensing circuitry contributes to the manufacturing expenses and limitations for fabricating the touchscreen panels. Thus, it may be beneficial to reduce the number of layers of sensing circuitry used to fabricate touchscreen panels.

SUMMARY

The present disclosure provides a capacitive sensing structure, comprising: a matrix of sensor cells, wherein each sensor cell comprises: a pair of transmit electrodes separated by a channel, the pair of transmit electrodes including a first transmit electrode and a second transmit electrode, a set of force lines disposed within the channel and connecting the pair of transmit electrodes in parallel with other pairs of transmit electrodes in a row of sensor cells, and one or more sensing electrodes disposed on opposite sides of the sensor cell and adjacent respective ones of the first and second transmit electrodes; wherein respective columns of sensor cells are connected by sets of force lines disposed along the channels of respective sensor cells in the column, each of the sets of force lines terminating at respective pairs of transmit electrodes comprising the sensor cells in the column; and sense lines coupled to the sensing electrodes disposed in a column of sensor cells.

Another embodiment provides a capacitive sensing structure, comprising: a first sensing electrode extending in a first direction along a first edge of a sensing cell; a second sensing electrode extending in the first direction along a second edge of the sensing cell; a pair of transmit electrodes arranged adjacent to each other in a second direction at least substantially perpendicular to the first direction; a channel region extending in the first direction between the pair of transmit electrodes; a first transmit conductor extending in the first direction through the channel region of the sensing cell; a second transmit conductor extending in the first direction parallel to the first transmit conductor within the channel region and terminating in the cell in electrical contact with a first one of the pair of transmit electrodes; and a third transmit conductor extending in the first direction parallel to the first transmit conductor within the channel region and terminating in the cell in electrical contact with a second one the pair of transmit electrodes.

Yet another embodiment provides a capacitive sensing structure, comprising: a matrix of sensing cells arranged in rows and columns, wherein each sensing cell comprises: a first sensing electrode extending in a first direction; a pair of transmit electrodes arranged adjacent to each other in a second direction at least substantially perpendicular to the first direction; and a channel region extending in the first direction between the pair of transmit electrodes; wherein the first sensing electrodes of a plurality of sensing cells in each column are electrically connected in series to form a column sensing line; a first transmit conductor extending in the first direction through the channel regions of a plurality of sensing cells in one column and electrically contacting the pair of transmit electrodes in one of the sensing cells; a second transmit conductor extending in the first direction through the channel regions of the plurality of sensing cells in said one column parallel to the first transmit conductor and terminating in another one of the sensing cells in electrical contact with a first one of the pair of transmit electrodes; and a third transmit conductor extending in the first direction through the channel regions of the plurality of sensing cells in said one column parallel to the first transmit conductor and terminating in said another one of the sensing cells in electrical contact with a second one of the pair of transmit electrodes.

Another embodiment provides a capacitive sensing structure, comprising: columns of parallel-connected force trees, wherein each force tree forms a column of sensor cells and comprises: pairs of transmit electrodes extending along the column of sensor cells, each pair of transmit electrodes including a first transmit electrode connected in parallel with a second transmit electrode, and sets of force lines, each set of force lines connecting a pair of transmit electrodes to control circuitry and connecting the pair of transmit electrodes in parallel with other pairs of transmit electrodes in other respective force trees to form a row of sensor cells; columns of sensing electrodes each disposed between the columns of parallel-connected force trees; and sense lines connected to each column of sensing electrodes.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

Figure 1:
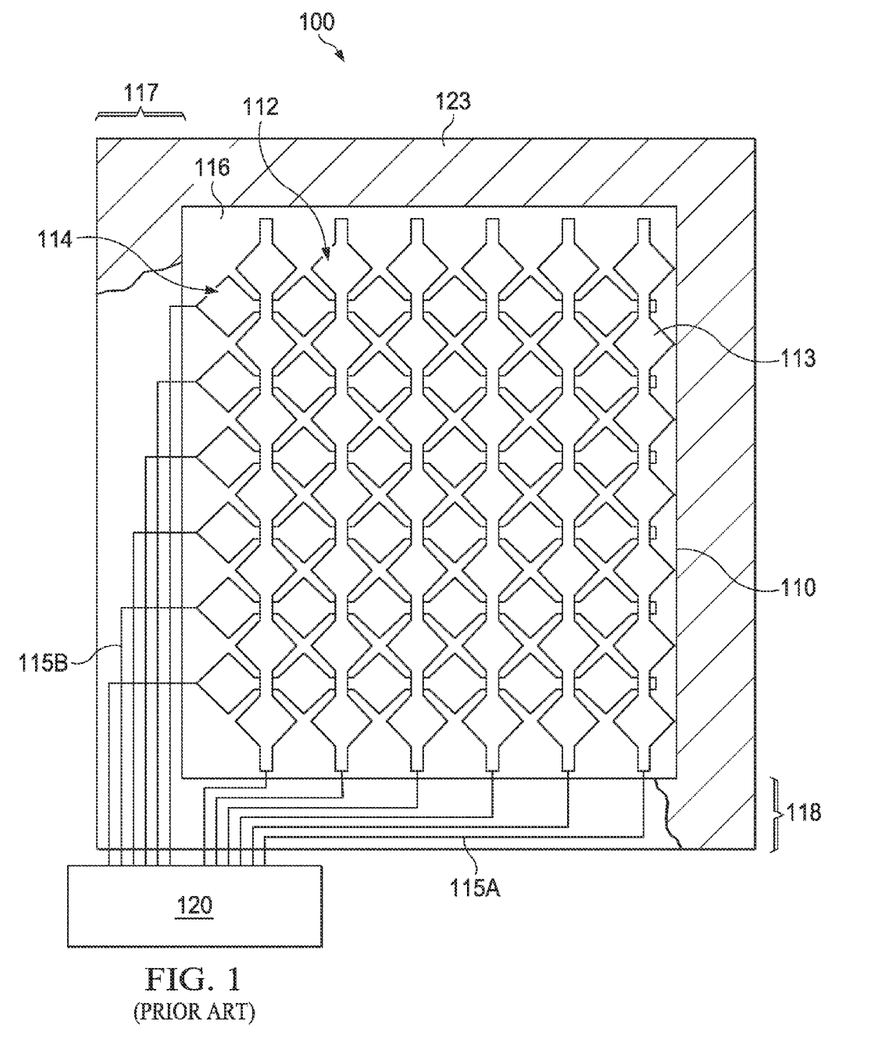
FIG. 1 illustrates an example of a bordered touchscreen panel.

FIG. 1 illustrates an example of a touchscreen panel 100, such as that typically used in an electronic device such as a smart phone, GPS device, tablet computer, mobile media player, remote control device, or any other devices capable of using a touchscreen panel. The touchscreen panel 100 includes an active portion 110 capable of displaying content and detecting a user touch. The touchscreen panel 100 is formed from multiple ITO layers, namely, first ITO layer 112 and second ITO layer 114, disposed within the perimeter of the active portion 110. The first and second ITO layers 112 and 114 are separated by a dielectric layer 116. The first ITO layer 112 includes columns of interconnected capacitive-sensing nodes 113, and a first layer of traces 115A coupled to each column of capacitive-sensing nodes 113 in the first ITO layer 112. The second ITO layer 114 includes rows of interconnected capacitive-sensing nodes 113, and a second layer of traces 115B coupled to each row of capacitive-sensing nodes 113 in the second ITO layer 114. The first and second layers of traces 115A and 115B couple each respective row or column of capacitive-sensing nodes 113 to control circuitry 120. The control circuitry 120 may include circuitry for providing current to the ITO layers 112 and 114 and detecting signals generated by the capacitive-sensing nodes 113. The control circuitry 120 may also include logic circuitry for processing signals and conveying touch information to other parts of the electronic device, such as a processor.

As shown in FIG. 1, the layers of traces 115A and 115B occupy space along the perimeter of the touchscreen panel 100, resulting in border areas 117 and 118. The border areas 117 and 118 provide a region where the layers of traces 115A and 115B may be routed to respective columns and rows of interconnected capacitive-sensing nodes 113. The border areas 117 and 118 are not placed over the active portion 110 and generally do not function as part of an active area of the touchscreen panel 100. As a result, an inactive border region 123 (also referred to as a border) surrounds the active portion 110 of the touchscreen panel 100, thereby limiting the available portion of the touchscreen panel 100 to be used for touch sensing and/or display purposes.

Figure 2A:
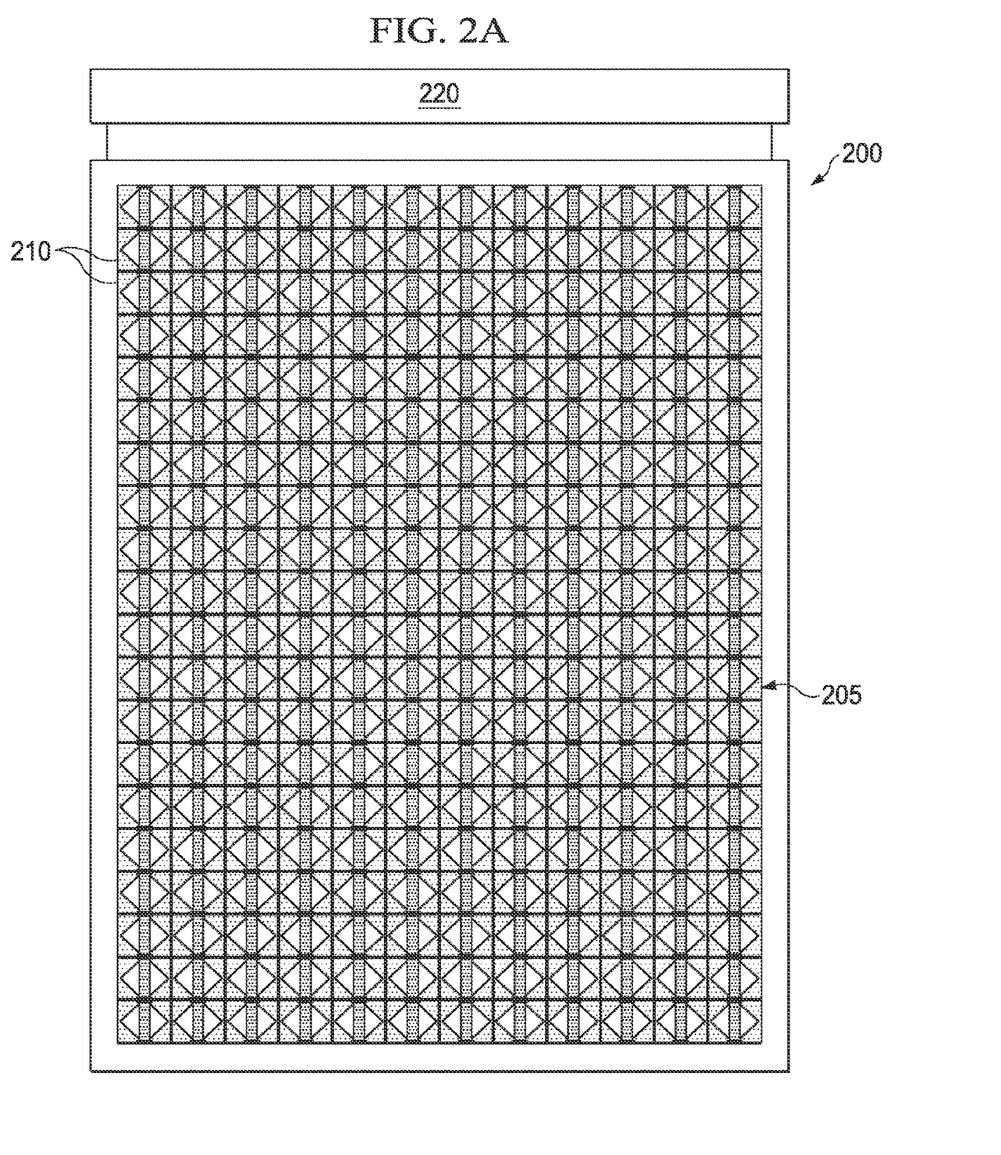
FIG. 2A illustrates an embodiment of a touchscreen panel incorporating a single ITO layer design.

FIG. 2A illustrates an embodiment of a touchscreen panel 200 incorporating a single ITO layer design, wherein the touchscreen panel 200 may be incorporated in an electronic device such as a smart phone, GPS device, tablet computer, mobile media player, remote control device, or any other devices capable of implementing a touchscreen panel. The touchscreen panel 200 includes an active portion 205 capable of displaying content and detecting a user touch (e.g., finger, stylus, etc.). The active portion 205 comprises a matrix of sensor cells 210 capable of detecting a user touch. Control circuitry 220 is also illustrated in FIG. 2A. The control circuitry 220 may include logic circuitry for processing signals and conveying touch information to other parts of the electronic device, such as a processor.

As illustrated in the following figures and explained in greater detail below, the matrix of sensor cells 210 is formed from a single ITO layer of capacitive sensor pads, sensor bars, force lines and sense lines (also referred to herein as transmit electrodes, sensing electrodes, transmit lines, and sensing lines, respectively). By incorporating a single ITO layer design, the touchscreen panel 200 may be manufactured at a lower cost (compared to multiple ITO layer designs) while maintaining the same functionality as a conventional touchscreen panel formed of multiple ITO layers, such as that illustrated in FIG. 1 and described above. Furthermore, by utilizing a single ITO layer design, the touchscreen panel 200 may be more easily incorporated in a borderless design, that is, a design wherein the touchscreen panel 200 lacks the aforementioned inactive border region along all but one side of the active portion 205. A borderless touchscreen panel may exploit the space dedicated to the touchscreen panel by not requiring additional room for inactive border regions. Thus, the active area of a borderless touchscreen panel may be larger than the active area of a bordered touchscreen panel that would otherwise be installed in a particular device.

Figure 2B:
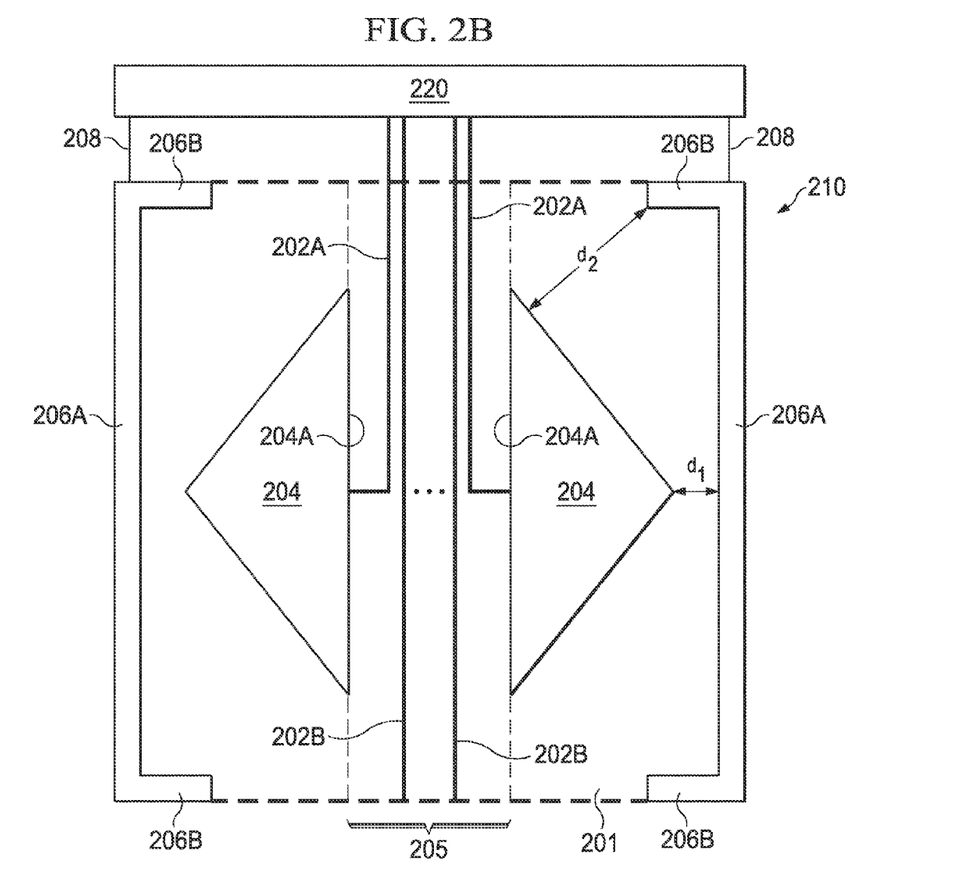
FIG. 2B illustrates a first representative embodiment of a sensor cell incorporated in the touchscreen panel provided in FIG. 2A.

A first representative embodiment of one of the sensor cells 210 is illustrated in FIG. 2B. The sensor cell 210 in FIG. 2B is formed from a single ITO layer disposed above a supporting substrate 201. The single ITO layer includes a pair of opposed sensor pads 204 connected to force lines 202 and a pair of sensor bars 206 connected to sense lines 208. The opposed sensor pads 204 are centered within the sensor cell 210 and are separated by a channel 205 that is generally defined by the distance between opposing sides 204A of the sensor pads 204. Sets of force lines 202 are disposed within the channel 205 to connect respective pairs of sensor pads 204 to the control circuitry 220. As explained in greater detail below, each set of force lines 202 also connects the pair of sensor pads 204 in parallel with other sensor pads comprising other sensor cells in the same row as the sensor cell 210 shown in FIG. 2B. As shown in FIG. 2B, the set of force lines 202A terminate at the opposed sides 204A of the sensor pads 204, whereas remaining sets of force lines 202B continue within the channel 205, to connect to downstream pairs of sensor pads 204 in the present column of sensor cells. Again, although it is not shown in the embodiment illustrated in FIG. 2B, the set of force lines 202A also connects the pair of sensor pads 204 in parallel with other pairs of sensor pads in the same row.

The sensor bars 206 are generally disposed adjacent the sensor pads 204 along the lateral edges of the sensor cell 210 and include a vertical segment 206A and horizontal segments 206B. The closest portions of the vertical segments 206A are spaced apart from the adjacent sensor pads 204 by a first distance $d_1$, and the horizontal segments 206B are spaced apart from the adjacent sensor pads 204 by a second distance $d_2$. In some embodiments, the distances $d_1$ and $d_2$ may be equal to each other, or may differ so long as a capacitance formed between the sensor bars 206 and adjacent sensor pads 204 may be properly measured. To this end, the sensor bars 206 are separated from adjacent sensor pads 204 and force lines 202 by an overlying dielectric layer.

The sensor bars 206 are connected to the control circuitry via sense lines 208. The sense lines 208 are connected to the sensor bars 206 of the first row of sensor cells 210 in the matrix. The sensor bars 206 extend along the length of the matrix of sensors 210 to form a column of sensor bars 206 on both sides of the sensor cells 210, wherein each column of sensor bars 206 is connected to the control circuitry 220 via the sense lines 208 and interposed sensor bars 206. It should be appreciated that, in some embodiments, the sensor cell 210 may only include sensor bars 206 on a single side of the sensor cell 210. In such an embodiment, an outside column of sensor cells 210 in the matrix may either: i) not provide sensing capabilities, or ii) include the sensor bars 206 on both sides of the sensor cells 210 in the outside column to provide full sensing capabilities.

Figure 2C:
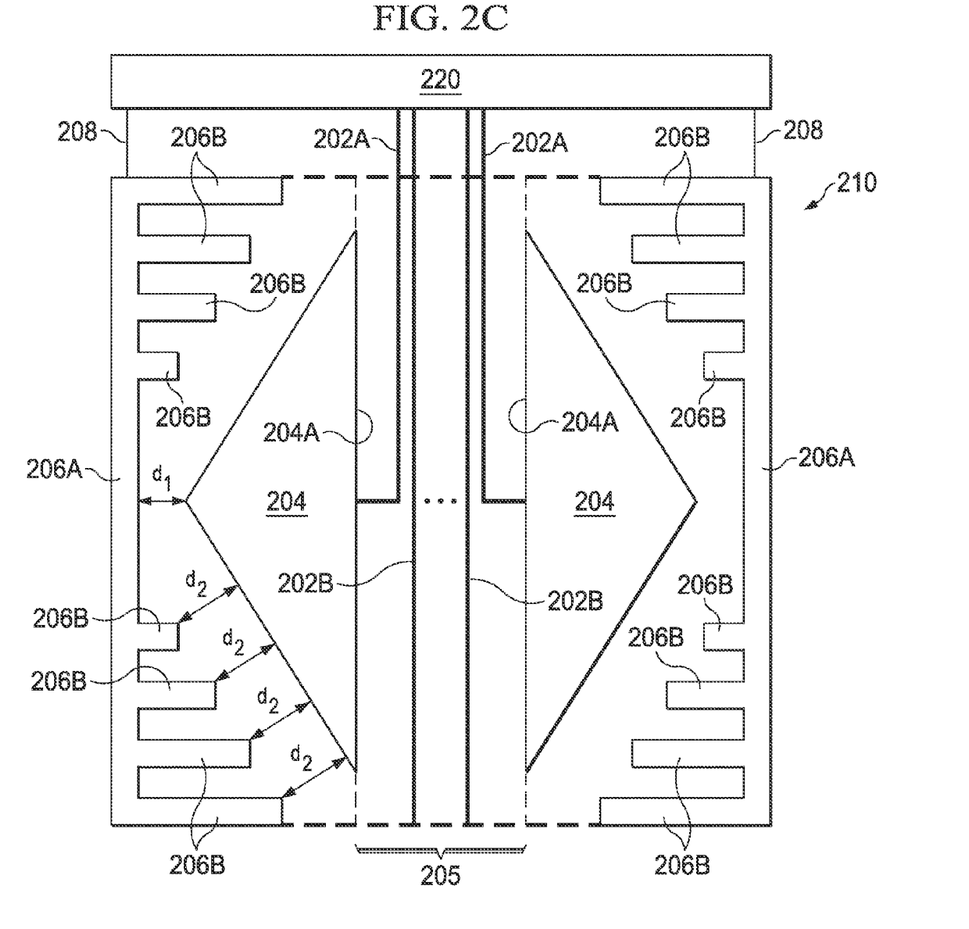
FIG. 2C illustrates a second representative embodiment of a sensor cell incorporated in the touchscreen panel provided in FIG. 2A.

A second representative embodiment of one of the sensor cells 210 is illustrated in FIG. 2C. The sensor cell 210 in FIG. 2C is formed from a single ITO layer disposed above a supporting substrate 201, and is similar to that illustrated in FIG. 2B and described above, except that the sensor cell 210 of FIG. 2C includes a greater number of horizontal sensor bar segments 206B. As shown in FIGS. 2B and 2C, because the sensor pads 204, force lines 202, sensor bars 206 and sense lines 208 are fabricated of a single ITO layer, they are generally aligned in a consistent (e.g., vertical) orientation to avoid any overlap and subsequent shorted connections.

FIGS. 2B and 2C also illustrate the control circuitry 220 coupled to the force lines 202 and sense lines 208 for processing signals to detect and process a user touch. In general, the control circuitry 220 applies a drive signal to force lines 202 connected to the sensor pads 204 to generate a mutual capacitance between the sensor pads 204 and adjacent sensor bars 206. A user touch at the location of the sensor cell 210 affects the mutual capacitance formed between the sensor pads 204 and adjacent sensor bars 206. The capacitance between the sensor pads 204 and adjacent sensor bars 206 is then sensed by the control circuitry 220 using sense lines 208 connected to the sensor bars 206. Based on the signals received via the sense lines 208, the control circuitry 220 is capable of performing various operations including detecting the presence of a user touch, resolving the location of the user touch relative to the matrix of sensors 210, and providing a signal for controlling other circuitry responsive to the detected user touch.

Figure 3:
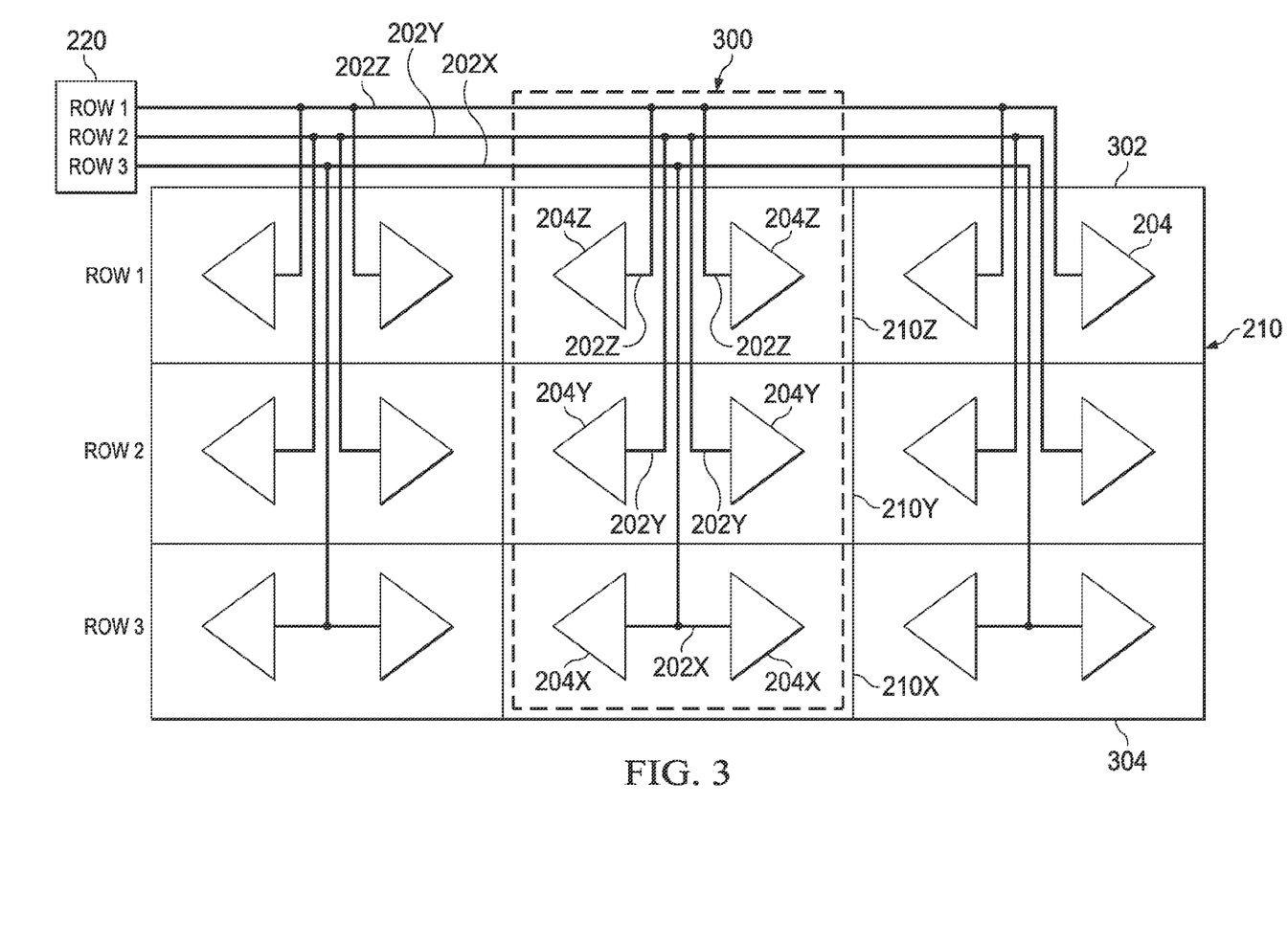
FIG. 3 illustrates an example embodiment of a design wherein force trees are used to form rows of sensor cells.

Because the sensor cells 210 are formed using a single ITO layer design, rows of sensor cells 210 and, more particularly, rows of sensor pads 204 cannot be connected in series due to interposed columns of sensor bars 206. Accordingly, FIG. 3 illustrates an example embodiment (not shown to scale) of a design wherein columns of multiplexed force lines 202 and sensor pads 204, referred to collectively as force trees 300, are used to form virtual rows of sensor cells 210. FIG. 3 also shows that columns of sensor cells 210 may be formed from columns of parallel-connected force trees 300.

In FIG. 3, an exemplary representation of three rows (and columns) of sensor cells 210 is shown (without the interposed sensor lines 208 and sensor bars 206) formed from the force trees 300 extending from the top 302 of the panel towards the bottom 304 of the panel. Furthermore, each column of sensor cells 210 is formed from a single force tree 300. To ensure consistent measurement sensitivity at each row of sensor cells 210 in the matrix, a consistent resistance is maintained along the lengths of each of the force lines 202. Because the lengths of the force lines 202 in the touchscreen panel may vary in accordance with the locations of the respective sensor cells 210 at which they terminate, the resistance may be controlled by varying the widths of respective force lines 202 so that a consistent resistance can be maintained for all lengths of the force lines 202. In some embodiments, each force tree 300 is formed such that the force line 202 of the end pair of sensor pads 204 in the force tree 300 has the largest track width, with the force lines 202 of each subsequent pair of sensor pads 204 in the force tree 300 having a reduced track width. For example, with reference to the force tree 300 illustrated in FIG. 3, the set of force lines 202X extending to the pair of sensor pads 204X comprising sensor cell 210X has the greatest length and also has the greatest width (e.g., 200 µm). Subsequent set of force lines 202Y extending to the pair of sensor pads 204Y comprising sensor cell 210Y is shorter than force line 202X and is split into two branches that have a combined width (e.g., 180 µm) that is less than that of force line 202X. The last set of force lines 202Z extending to the pair of sensor pads 204Z comprising sensor cell 210Z is shorter than force lines 202Y and is also split into two branches that have a combined width (e.g., 150 µm) less than that of combined force lines 202Y.

Typically, the channel that runs between the pair of sensor pads 204 in a sensor cell 210 is a fixed width to maintain a consistent pitch for each of the sensor cells 210 in the matrix. Naturally, the width of the channel limits the size and number of force lines 202 that may be disposed therein. It will be understood from additional embodiments described herein that, in some embodiments, it is possible to extend the length of a column of sensor cells 210 by adding a force tree 300 that extends from the bottom 304 of the panel towards the top 302 of the panel.

Figure 4:
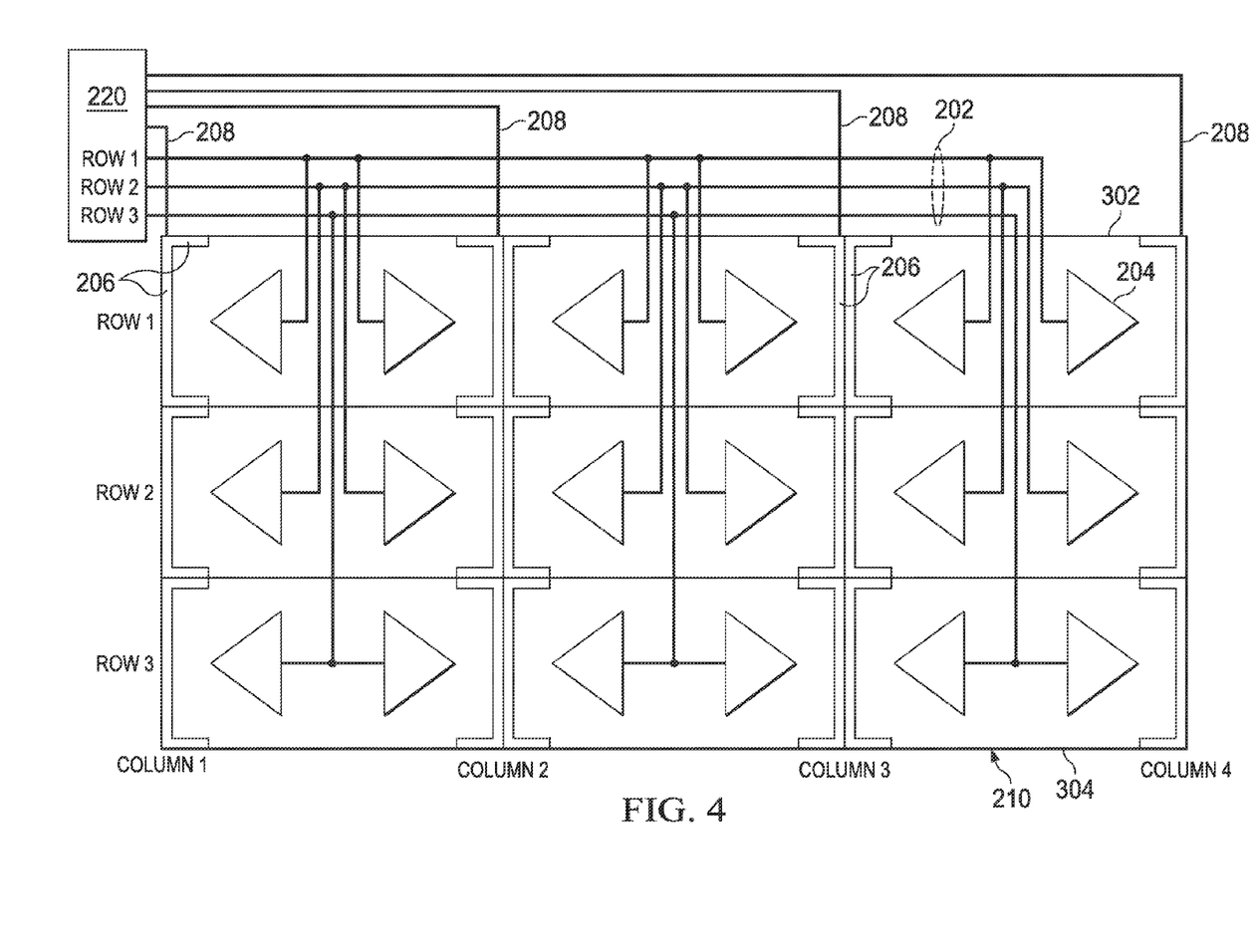
FIG. 4 illustrates the design of FIG. 3 updated to include columns of sense lines and sensor bars.

FIG. 4 illustrates the example embodiment of FIG. 3, wherein the rows of sensor cells 210 are shown to include columns of sense lines 208 and sensor bars 206. As shown in FIG. 4, each column of sensor bars 206 is coupled to the control circuitry 220 via sense lines 208. In some embodiments, each column of sensor bars 206 in a column of sensor cells 210 may each use a single sense line 208 (e.g., similar to what is shown in FIGS. 2B and 2C). In accordance with the embodiment illustrated in FIG. 4, the control circuitry 220 may provide a drive signal to the force lines 202 of particular rows of sensor pads 204 in each of the force trees 300 to generate a mutual capacitance between those rows of sensor pads 204 in the force tree 300 and adjacent sensor bars 206. The mutual capacitance formed between the driven rows of sensor pads 204 and adjacent sensor bars 206 is then sensed, or measured, by the control circuitry 220 using the sense lines 208. The control circuitry 220 then resolves the location of a user touch in the matrix of sensor cells 210 by sensing a change in the mutual capacitance, and determining the location of the change in mutual capacitance by comparing the row of sensor pads 204 to which the drive signal was applied with the column corresponding to the sense line(s) 208 on which the change in mutual capacitance was sensed.

Figure 5:
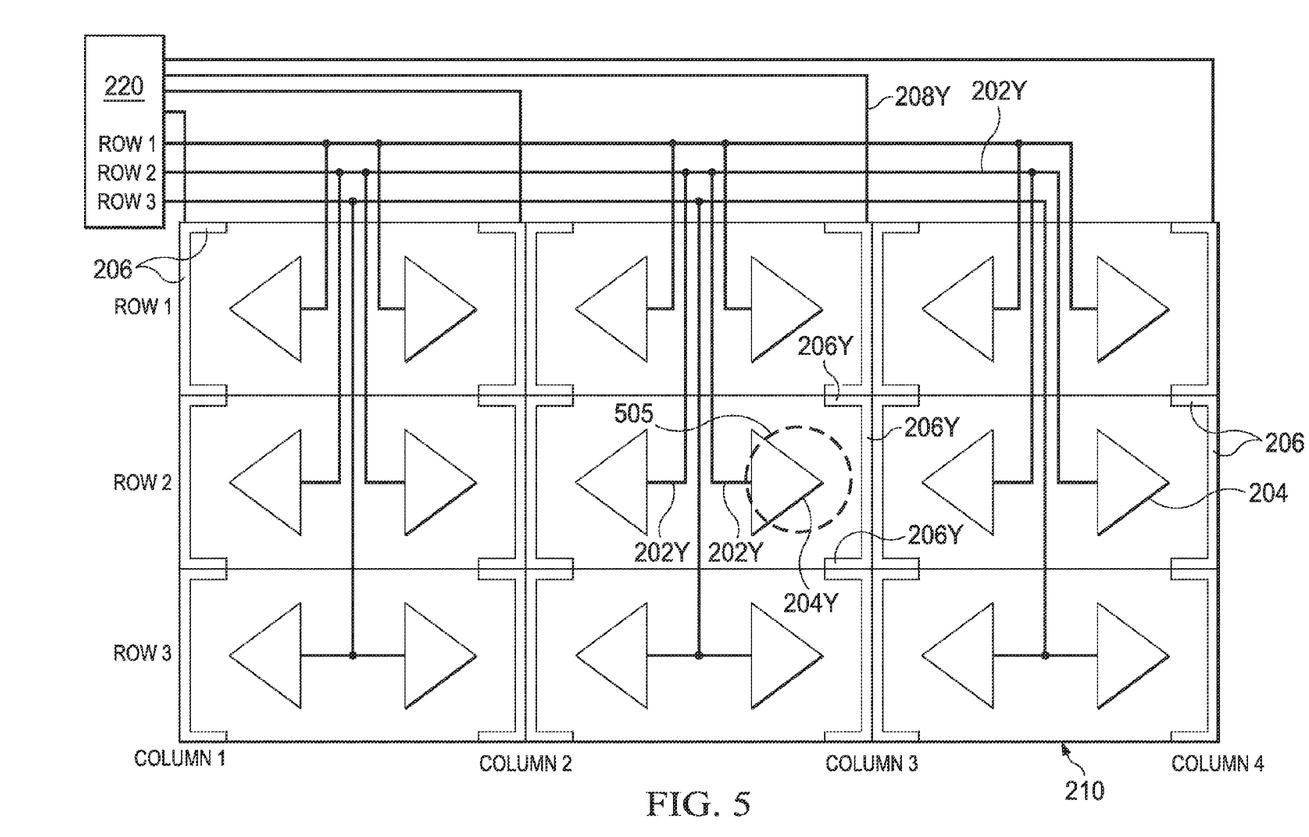
FIG. 5 illustrates an example embodiment wherein the design of FIG. 4 is used to detect a user touch.

For example, FIG. 5 illustrates an example embodiment wherein the control circuitry 220 applies the drive signal to the force lines 202Y connected to the sense pads 204Y located in Row 2. In this embodiment, a user touch (represented by dashed circle 505) affects the mutual capacitance formed between sense pad 204Y and adjacent sensor bars 206Y located at Column 3 Accordingly, a corresponding change in mutual capacitance is sensed on sense line 208Y. The control circuitry 220 then determines that the user touch 505 occurs near the intersection of the row of active sense pads 204 (Row 2) and the column corresponding to the sense lines 208Y sensing the change in capacitance (Column 3).

Figure 6:
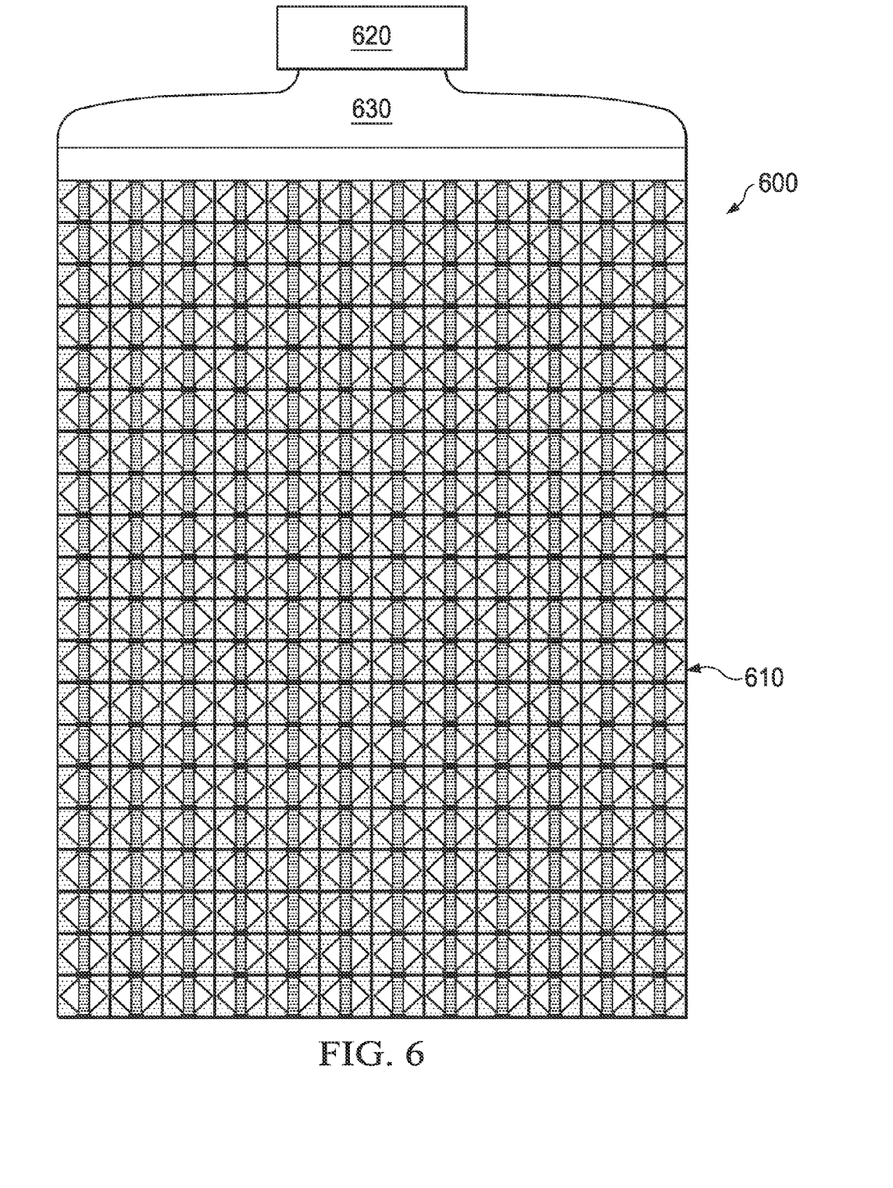
FIG. 6 illustrates an embodiment of the disclosed single ITO layer design implemented in a borderless touchscreen panel.

The embodiment illustrated in FIGS. 3-5 corresponds to an implementation wherein the force lines 202 and sense lines 208 are routed along a single side of the touchscreen panel 200. Accordingly, the embodiment of the touchscreen panel 200 illustrated in FIGS. 3-5 may be incorporated in a borderless touchscreen panel design. Such designs may route the single ITO layer of sense lines 208 and force lines 202 to the control circuitry 220 using an external flexible printed circuit board (FPCB) mounted to the touchscreen panel 200. An example of a borderless touchscreen panel 600 (having an active portion 610) coupled to control circuitry 620 via an FPCB 630 is illustrated in FIG. 6.

Figure 7:
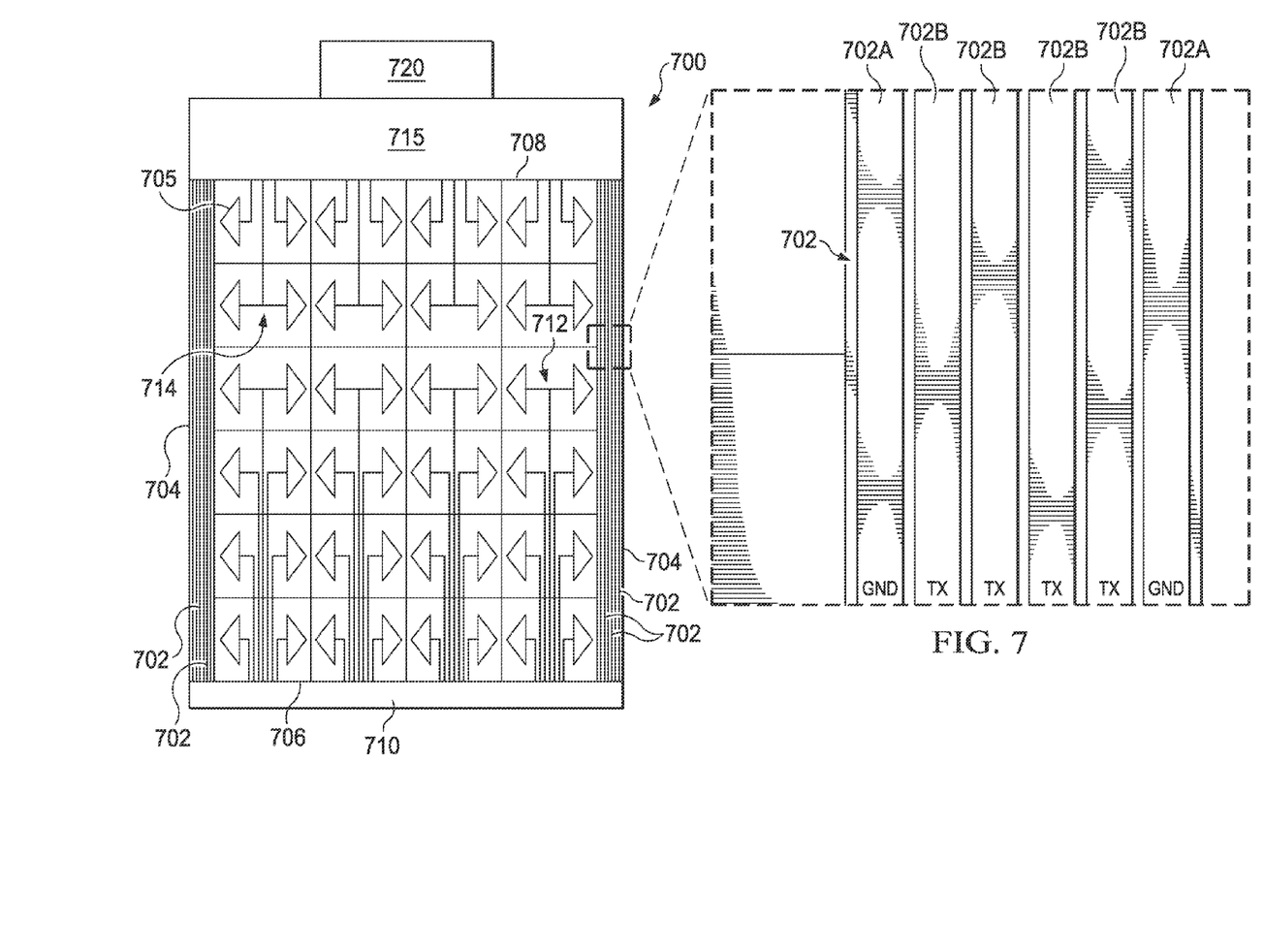
FIG. 7 illustrates an embodiment of the disclosed single ITO layer design wherein at least a portion of the force lines are routed along sides of the touchscreen panel.

The disclosed single ITO layer touchscreen design is not limited to borderless touchscreen panels. For example, FIG. 7 illustrates an example embodiment of a touchscreen panel 700 wherein at least a portion of the force lines 702 are routed along sides 704 of the panel 700 and coupled to sensor pads 705 from the bottom side 706 of the panel 700, using an FPCB 710, to form force trees 712 extending from the bottom side 706 of the panel 700. The sense lines (not shown) and remaining force lines 702 are routed from the top side 708 of the panel 700 such that the sense lines are connected to columns of sensor bars (not shown), and the remaining force lines 702 are coupled to sensor pads 705 to form force trees 714 extending from the top side 708 of the panel 700. In the embodiment illustrated in FIG. 7, the force lines 702 and sense lines are coupled to control circuitry 720 via an FPCB 715 mounted to the top side 708 of the touchscreen panel 700.

In some embodiments, the force lines 702 routed along the sides 704 of the panel 700 may incorporate a ground ring design as shown in FIG. 7. In such embodiments, this may be accomplished by grounding the outer force lines 702A and transmitting the drive signal using the inner force lines 702B.

Figure 8:
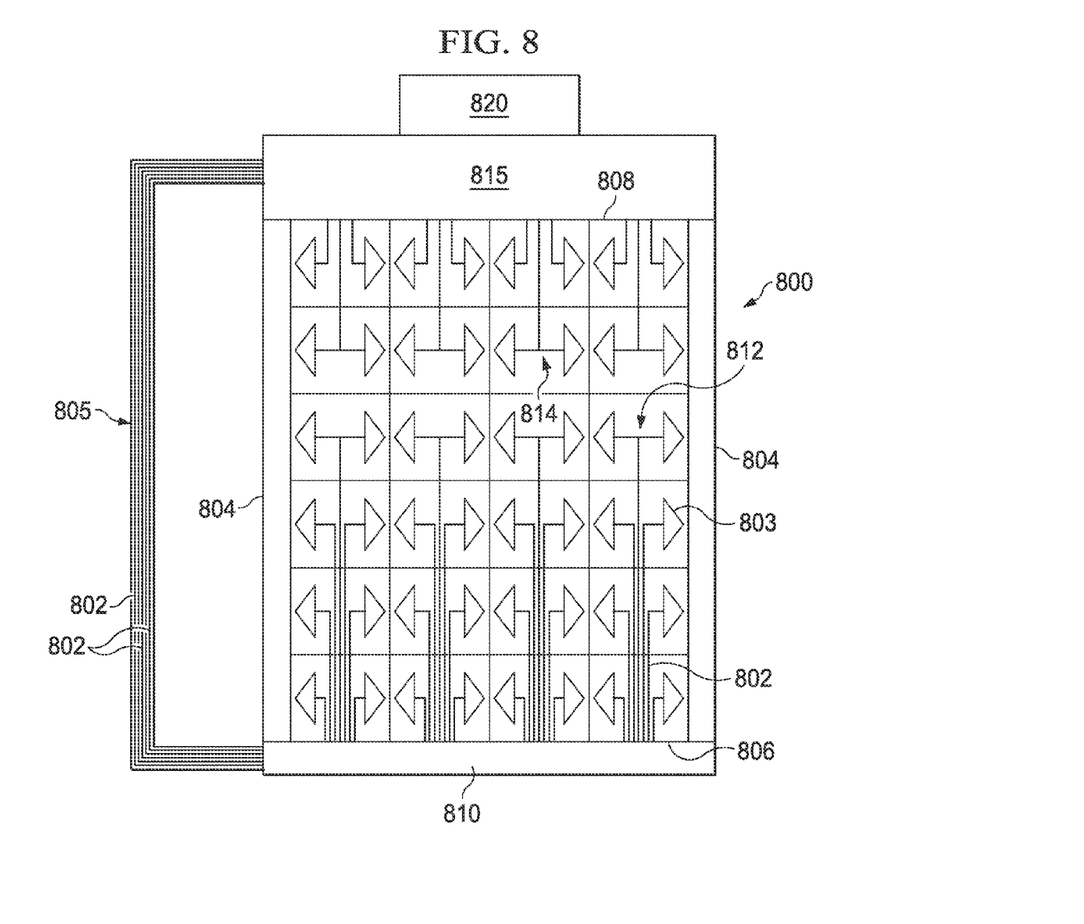
FIG. 8 illustrates another embodiment of the disclosed single ITO layer design wherein at least a portion of the force lines are routed using an FPCB tail.

FIG. 8 illustrates another example embodiment of a non-borderless touchscreen panel 800. The touchscreen panel 800 is similar to that illustrated in FIG. 7, except that instead of routing force lines 802 along the sides 804 of the panel 800, the force lines are routed to the bottom side 806 of the panel 800 using an FPCB tail 805 extending between a bottom FPCB 810 and a top FPCB 815. As discussed above, at least a portion of the force lines 802 are routed along the FPCB tail 805 and bottom FPCB 810 and are coupled to sensor pads 803 from the bottom side 806 of the panel 800 to form force trees 812 extending from the bottom side 806 of the panel 800. The sense lines (not shown) and remaining force lines 802 are routed from the top side 808 of the panel 800 such that the sense lines are connected to columns of sensor bars (not shown) and remaining force lines 802 are coupled to sensor pads 803 to form force trees 814 extending from the top side 808 of the panel 800. In the embodiment illustrated in FIG. 8, the force lines 802 and sense lines are coupled to control circuitry 820 via the FPCB 815 mounted to the top side 808 of the touchscreen panel 800.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A capacitive sensing structure, comprising:
 a matrix of sensor cells, wherein each sensor cell comprises:
  a pair of transmit electrodes separated by a channel, the pair of transmit electrodes including a first transmit electrode and a second transmit electrode,
  a set of force lines disposed within the channel and connecting the pair of transmit electrodes in parallel with other pairs of transmit electrodes in a row of sensor cells, and
  one or more sensing electrodes disposed on opposite sides of the sensor cell and adjacent respective ones of the first and second transmit electrodes;
 wherein respective columns of sensor cells are connected by sets of force lines disposed along the channels of respective sensor cells in the column, each of the sets of force lines terminating at respective pairs of transmit electrodes comprising the sensor cells in the column; and
 electrical connection of the sensing electrodes disposed in a column of sensor cells; and
 wherein the transmit electrodes, sensing electrodes and force lines are formed from a single indium tin oxide (ITO) layer.

2. The capacitive sensing structure of claim 1, further comprising control circuitry operable to apply a drive signal to the sets of force lines and to receive a sense signal from the sense lines.

3. The capacitive sensing structure of claim 2, wherein responsive to the drive signal, a set of force lines is operable to generate, for a row of sensor cells, a capacitance between pairs of transmit electrodes and adjacent sense electrodes.

4. The capacitive sensing structure of claim 2, wherein the sense signal is indicative of a capacitance formed between at least one of the first and second transmit electrodes and adjacent sensing electrodes in a sensor cell.

5. A capacitive sensing structure, comprising:
 a first electrode extending in a first direction along a first edge of a sensing cell;
 a second electrode extending in the first direction along a second edge of the sensing cell;
 a pair of third electrodes arranged adjacent to each other in a second direction at least substantially perpendicular to the first direction;
 a channel region extending in the first direction between the pair of third electrodes;
 a first conductor extending in the first direction through the channel region of the sensing cell;
 a second conductor extending in the first direction at least substantially parallel to the first conductor within the channel region and terminating in the cell in electrical contact with a first one of the pair of third electrodes; and
 a third conductor extending in the first direction at least substantially parallel to the first conductor within the channel region and terminating in the cell in electrical contact with a second one the pair of third electrodes.

6. The capacitive sensing structure of claim 5, wherein the first electrode further includes a first plurality of segments extending in the second direction toward the pair of third electrodes.

7. The capacitive sensing structure of claim 6, wherein the second electrode further includes a second plurality of segments extending in the second direction toward the pair of third electrodes.

8. The capacitive sensing structure of claim 5, wherein the first electrode, second electrode and pair of third electrodes are formed on a single conductive layer above a supporting substrate.

9. The capacitive sensing structure of claim 8, wherein the first through third conductors are formed on the same single layer as the first electrode, second electrode and pair of third electrodes.

10. The capacitive sensing structure of claim 5, wherein the first conductor extends from a third edge of the sensing cell to a fourth edge of the sensing cell.

11. The capacitive sensing structure of claim 10, wherein the second and third conductors extend from the third edge of the sensing cell.

12. The capacitive sensing structure of claim 5, wherein the first conductor has a first width and the second and third conductors each have a second width, wherein the second width is less than the first width.

13. The capacitive sensing structure of claim 12, wherein the second width is less than one half of the first width.

14. The capacitive sensing structure of claim 5, further comprising circuitry for electrically connecting the second and third conductors together at a location outside of the sensing cell.

15. The capacitive sensing structure of claim 5, wherein the sensing cell has a square perimeter shape.

16. A capacitive sensor, comprising:
 a matrix of sensing cells arranged in rows and columns, wherein each sensing cell comprises:
  a first electrode extending in a first direction;
  a pair of second electrodes arranged adjacent to each other in a second direction at least substantially perpendicular to the first direction; and
  a channel region extending in the first direction between the pair of second electrodes;
 wherein the first electrodes of a plurality of sensing cells in each column are electrically connected in series to form a column line;
 a first conductor extending in the first direction through the channel regions of a plurality of sensing cells in one column and electrically contacting the pair of second electrodes in one of the sensing cells;
 a second conductor extending in the first direction through the channel regions of the plurality of sensing cells in said one column at least substantially parallel to the first conductor and terminating in another one of the sensing cells in electrical contact with a first one of the pair of second electrodes; and
 a third conductor extending in the first direction through the channel regions of the plurality of sensing cells in said one column at least substantially parallel to the first conductor and terminating in said another one of the sensing cells in electrical contact with a second one of the pair of second electrodes.

17. The capacitive sensor of claim 16, further comprising force circuitry coupled to the first, second and third conductors and configured to apply a force signal.

18. The capacitive sensor of claim 17, further comprising sense circuitry coupled to the column line and configured to receive a sense signal.

19. The capacitive sensor of claim 17, wherein the second and third conductors are electrically connected to receive a same force signal.

20. The capacitive sensor of claim 19, wherein each column of the matrix includes the first, second and third conductors.

21. The capacitive sensor of claim 20, wherein the first transmit conductors of the plurality of columns are electrically connected to receive a same force signal and thus activate the pairs of transmit electrodes in a row of the matrix.

22. The capacitive sensor of claim 20, wherein the second and third conductors of the plurality of columns are electrically connected to receive a same force signal and thus activate the pairs of second electrodes in a row of the matrix.

23. The capacitive sensor of claim 16, further comprising a third electrode extending in the first direction, wherein the third electrodes of a plurality of sensing cells in each column are electrically connected in series to form another column line.

24. The capacitive sensor of claim 23, wherein the first and third electrodes are positioned on opposite edges of the sensing cell.

25. The capacitive sensor of claim 24, wherein the third electrode further includes a plurality of sense segments extending in the second direction toward the pair of second electrodes.

26. The capacitive sensor of claim 16, wherein the first electrode further includes a plurality of sense segments extending in the second direction toward the pair of second electrode.

27. The capacitive sensor of claim 16, wherein the first electrode and pair of second electrodes are formed on a single conductive material layer above a supporting substrate.

28. The capacitive sensor of claim 27, wherein the first through third conductors are formed on the same single conductive material layer as the first electrode and pair of second electrodes.

29. The capacitive sensor of claim 16, wherein the first conductor extends from an edge of the sensing cell to an opposite edge of the sensing cell.

30. The capacitive sensor of claim 29, wherein the second and third conductors extend from said edge of the sensing cell.

31. The capacitive sensor of claim 16, wherein the first conductor has a first width and the second and third conductors each have a second width, wherein the second width is less than the first width.

32. The capacitive sensor of claim 31, wherein the second width is less than one half of the first width.

33. The capacitive sensor of claim 16, wherein each sensing cell has a square perimeter shape.

34. A capacitive sensing structure, comprising:
 columns of parallel-connected force trees, wherein each force tree forms a column of sensor cells and comprises:
  pairs of transmit electrodes extending along the column of sensor cells, each pair of transmit electrodes including a first transmit electrode connected in parallel with a second transmit electrode, and
  sets of force lines, each set of force lines connecting a pair of transmit electrodes to control circuitry and connecting the pair of transmit electrodes in parallel with other pairs of transmit electrodes in other respective force trees to form a row of sensor cells;
 columns of electrically connected sensing electrodes each disposed between the columns of parallel-connected force trees; and
 wherein the force trees and sensing electrodes are formed from a single indium tin oxide (ITO) layer.

* * * * *

UNITED STATES PATENT AND TRADEMARK OFFICE
CERTIFICATE OF CORRECTION

PATENT NO.       : 9,246,485 B2
APPLICATION NO.  : 13/739112
DATED            : January 26, 2016
INVENTOR(S)      : Chee Yu Ng et al.

Page 1 of 1

It is certified that error appears in the above-identified patent and that said Letters Patent is hereby corrected as shown below:

In the claims,

At column 10, claim number 26, line number 14, please replace the word [electrode] with -- electrodes --.

Signed and Sealed this
Sixteenth Day of August, 2016

Michelle K. Lee
*Director of the United States Patent and Trademark Office*